United States Patent [19]

Minnis

[11] Patent Number: 5,412,347
[45] Date of Patent: May 2, 1995

[54] COMPACT CASCADABLE MICROWAVE AMPLIFIER CIRCUITS

[75] Inventor: Brian J. Minnis, Crawley, England

[73] Assignee: U.S. Philips Corporation, New York, N.Y.

[21] Appl. No.: 160,714

[22] Filed: Dec. 1, 1993

[30] Foreign Application Priority Data

Dec. 3, 1992 [GB] United Kingdom .................. 9225282
Jun. 17, 1993 [GB] United Kingdom .................. 9312472

[51] Int. Cl.$^6$ .............................................. H03F 3/60
[52] U.S. Cl. ..................................... 330/286; 330/306
[58] Field of Search ................ 330/277, 286, 302, 303, 330/306, 307, 310

[56] References Cited

U.S. PATENT DOCUMENTS

| | | | |
|---|---|---|---|
| 4,486,719 | 12/1984 | Ayasli | 330/286 |
| 4,595,881 | 6/1986 | Kennan | 330/54 |
| 4,853,649 | 8/1989 | Seino et al. | 330/277 |
| 4,876,516 | 10/1989 | Dougherty | 330/54 |
| 5,146,178 | 9/1992 | Nojima et al. | 330/306 X |
| 5,172,074 | 12/1992 | Shiga | 330/286 X |
| 5,315,265 | 5/1994 | Wisherd et al. | 330/306 X |
| 5,339,047 | 8/1994 | Mizan et al. | 330/306 X |

FOREIGN PATENT DOCUMENTS

| | | | |
|---|---|---|---|
| 0133080 | 2/1985 | European Pat. Off. | H03H 7/380 |
| 3726743 | 3/1988 | Germany | H03F 3/55 |

OTHER PUBLICATIONS

Ku et al., "Optimum Gain–Bandwidth Limitations of Transistor Amplifiers as Reactively Constrained Active Two-Port Networks", IEEE Trans. Circuits and Systems, vol. CAS-22, pp. 523-533, Jun. 1975.

Minnis, "Multi-Octave Active and Passive Components and Antennas", Digest No. 1989/75, pp. 4/1-4/5.

Jutzi, "A MESFET Distributed Amplifier with 2 GHz Bandwidth", Proceedings of the IEEE, Jun. 1969, pp. 1195-1196.

Liechti et al., "Design and Performance of Microwave Amplifiers with GaAs Schottky-Gate Field-Effect Transistors", IEEE Trans. Microwave Theory and Tech., vol. MTT-22, pp. 510-517, May 1974.

Hegazi et al., "A W-band Doubler/Amplifier Chain Using a MMIC Varactor Doubler and a MMIC Power Mesfet Amplifier", IEEE MTT-s Digest, vol. III, Jun. 10-14, 1991, pp. 934-936.

Tserng et al., "High-Efficiency Broadband Monolithic Pseudomorphic HEMT Amplifiers At Ka-Band", IEEE 1992 Microwave & Millimeter-Wave Monolithic Circuits Symposium, Publ. Date: Jan. 6, 1992, pp. 51-54.

Avasarala et al., "A 1.6 Watt High Efficiency 7-11 GHz Power MMIC", GaAs IC Symposium, pp. 365-368, Technical Digiest 1990, Oct. 7-10, 1990.

Yamamura et al., "4-8 GHz 1 W Cascadable Packaged GaAs FET Amplifier", Fujitsu-Scientific & Technical Journal, vol. 18, No. 2, Jun. 1982, pp. 179-198.

Primary Examiner—Steven Mottola
Attorney, Agent, or Firm—Robert J. Kraus

[57] ABSTRACT

A microwave amplifier circuit has input and output coupling circuits (21 and 22) designed on quite different matching principles to obtain a circuit compactness similar to a reactively-matched amplifier and cascadable electrical characteristics similar to a distributed amplifier. The input coupling circuit (21) is formed as a bandpass filter network (7a, 7b, 7c, 17a, 17b, 9) supporting a travelling wave to which the amplifying device (3) is capacitively connected. This input network (21) terminates in a resistor (9) in which the travelling wave is dissipated. The output coupling circuit (22) is a reactively matched circuit (8a, 8b, 18a, 18b) which also has a bandpass characteristic. By making the input network (21) bandpass (instead of low pass) a large amplifying device (3) can be used, without reducing line impedance and gain.

12 Claims, 4 Drawing Sheets

COMPACT CASCADABLE MICROWAVE AMPLIFIER CIRCUITS

BACKGROUND OF THE INVENTION

This invention relates to microwave amplifier circuits having a compact circuit configuration which may be fabricated with, for example, gallium arsenide monolithic microwave integrated circuit (MMIC) technology and which may have such good coupling at both input and output terminals (for example, over a bandwidth in excess of an octave) that several circuits of this type can be cascaded without undesirable interactions.

As MMIC technology advances and the application of MMICs in microwave systems becomes more widespread, there is strong pressure to reduce costs by increasing circuit density. The more circuits that can be accommodated on a single MMIC substrate, whether they be of the same or different functionality, the lower will be the material costs of the GaAs and the cost of subsequent assembly. An important factor in the successful integration of several circuits on a single substrate is the quality of the impedance match at input and output terminals. To ensure that the circuits can be cascaded on the substrate without unacceptable interactions, each circuit should have good input and output reflection coefficients.

There are at least two different traditional approaches to matching, namely: (1) the use of reactively matched networks to form both input and output coupling circuits, and (2) the adoption of a distributed amplifier configuration to provide both input and output matching.

Particular examples of approach (1) are described in the paper "Optimum Gain-Bandwidth Limitations of Transistor Amplifiers as Reactively Constrained Active Two-Port Networks" by W. H. Ku et al. in IEEE Trans. Circuits and Systems, Vol. CAS-22, pages 523 to 533 (June 1975), and the paper "Design and Performance of Microwave Amplifiers with GaAs Schottky-Gate Field-Effect Transistors" by C. A. Liechti et al. in IEEE Trans. Microwave Theory and Tech. Vol. MTT-22, pages 510 to 517 (May 1974); the whole contents of both these publications are hereby incorporated herein as reference material. A compact circuit configuration results from the use of reactively matched input and output coupling circuits for a single amplifier device (e.g. a GaAs Schottky-gate field-effect transistor, commonly termed "MESFET"). In the Liechti et al. paper, the output matching is modified to provide frequency compensation. However, such reactively-matched circuits generally have inferior wideband amplifier characteristics and inferior matching, as compared with distributed amplifiers.

Distributed amplifiers are wideband, provide flat gain, have excellent input and output reflection coefficients (S11 and S22) and have high tolerance to inaccuracies in circuit modelling or to variations in the fabrication process. Particular examples of the distributed amplifier approach are described in United States patent specifications U.S. Pat. No. 4,853,649, U.S. Pat. No. 4,486,719, U.S. Pat. No. 4,595,881, and U.S. Pat. No. 4,876,516, Proceedings Letters of IEEE (June 1969) pages 1195 to 1196 on "A MESFET Distributed Amplifier with 2 GHz Bandwidth" by W. Jutzi, and IEE (GB) Digest No. 1989/75 of the Colloquium "Multi-Octave Active and Passive Components and Antennas" pages 4/1 to 4/5 on "Designing Distributed Amplifiers for Prescribed Gain Slope" by the present inventor. The whole contents of all these publications are hereby incorporated herein as reference material.

FIG. 1 of U.S. Pat. No. 4,853,649 is a typical drawing of the equivalent circuit of a distributed amplifier comprising four field-effect transistors (FETs) 3 connected between two artificial transmission lines. The lines are formed by low-pass filter networks of inductors 7 and 8 and are terminated at each end by resistive loads. An input signal injected into the gate transmission line 7, propagates as a travelling wave along the line. This travelling wave develops a voltage on the gates 4 of the FETs 3 before being dissipated in the terminating load 9. The FETs 3 respond by translating the voltage excitations into currents which are then injected into the drain transmission line 8. Half the currents propagate in one direction and half propagate in the opposite direction; but the phases of these currents are such that those propagating towards the internal load 10 cancel, whilst those propagating towards the output 2 add together to produce the output signal. To ensure the correct phasing of the currents, the gate and drain artificial transmission lines 7 and 8 must be electrically identical. As low-pass filters, they must therefore have the same cut-off frequency $f_c$. The cut-off frequency also determines the operating frequency bandwidth of the amplifier. FIG. 1 of U.S. Pat. No. 4,853,649 illustrates a single amplifier stage, and several of these circuits (each comprising four FETs) can be cascaded together.

For simplicity, the artificial transmission lines of a distributed amplifier are often represented as a cascade of lowpass filter sections with constant K, for example as illustrated in FIG. 3a of U.S. Pat. No. 4,853,649. $K^2$ is the product of shunt and series impedances of the line. Using such an analysis of the lines, the following expressions for the characteristic impedance Zo and upper cut-off frequency $f_c$ can be obtained in terms of L and C, where L and C are the respective inductance and capacitance per unit cell.

$(Zo)^2 = L/C \ldots$ E(1)

$f_c = (\pi \cdot Zo \cdot C)^{-1} \ldots$ E(2)

If ohmic losses are ignored, an approximate expression for the power gain G of a distributed amplifier is:

$(n^2 \cdot gm^2 \cdot Rs, R1.)/4 \ldots$ E(3)

where gm is the mutual conductance of an individual FET, n is the number of FETs, Rs is the signal-source impedance, and R1 is the load resistance.

Rs and R1 are also equal to the characteristic impedances of the gate and drain lines. The expression E(3) is useful for indicating the effects of changes in gm or line impedance. However E(3) must be used with caution since, in the absence of losses, it implies there is no limit to the gain that can be achieved just by adding more FETs. In fact, the maximum achievable gain (MAG) is always less that the MAG of the individual FETs.

Despite its well known advantages, not least of which is its ability to be cascaded, the distributed amplifier suffers from two basic disadvantages. Firstly, it is larger than might be desirable for an individual gain stage. Secondly, half the output current of the FETs is wasted by travelling in the wrong direction on the drain line. The waste of current causes losses in efficiency and gain.

SUMMARY OF THE INVENTION

It is an aim of the present invention to provide a different design approach to the construction of such circuits which permits the achievement of desired electrical characteristics, such as the good impedance matching of a distributed amplifier, but in a more compact circuit configuration requiring considerably less space for its integration.

The applicant finds that this aim may surprisingly be achieved by adopting a bandpass filter network supporting a travelling wave and terminating in a resistor to provide the input coupling circuit to the amplifying device, and a reactively matched network with a bandpass characteristic as an output coupling circuit from the amplifying device.

Thus, according to the present invention there is provided a microwave circuit comprising an amplifying device which is connected to an input terminal by an input coupling circuit and to an output terminal by an output coupling circuit, wherein the input coupling circuit comprises a bandpass filter network for travelling-wave transmission within its passband and terminates in the input terminal at one end and a terminating resistor at the opposite end, and the amplifying device is connected at a capacitive node of the network for receiving an input signal from a travelling wave which is transmitted from the input terminal and which passes the capacitive node to be dissipated in the terminating resistor, and the output coupling circuit is a bandpass reactively-matched network having the amplifying device and the output terminal at opposite ends of the network.

Such a circuit is compact and may readily be fabricated with MMIC technology. Furthermore the circuit can be wideband with good impedance matching at both input and output.. As compared with a distributed amplifier, it offers most of the same attractive electrical properties but occupies only a fraction of the surface area. A most significant advantage over reactively matched amplifier circuits of comparable size is that an excellent match can be achieved at both input and output terminals for bandwidths in excess of an octave with a circuit configuration in accordance with the invention. This facilitates the cascading of several of the circuits without any undesirable interactions. Each stage may produce between 5 & 10 dB gain depending upon the frequency bandwidth, giving the potential for very high gain (for example more than 40 dB gain) in a multi-stage amplifier on one MMIC substrate. Furthermore both the input and output networks are such as may be designed in a systematic manner based on network synthesis, so facilitating the design of amplifier circuits for a wide variety of performance specifications.

Such a circuit constructed in accordance with the invention can be considered (with hindsight of the present invention) to be a non-obvious development from a distributed amplifier configuration. As compared with a distributed amplifier having a plurality of FETs, the novel steps in forming a single FET amplifier circuit in accordance with the invention are as follows: Remove all but one of the FETs of the distributed amplifier plus the remote (non-output) end of the drain artifical transmission line; there is then no longer a waste of half the available output power from the FET. To recover the gain lost by removing FETs, the single FET is increased in size. Ordinarily, this would severely reduce the upper operating frequency, but the difficulty is overcome by making the gate filter network bandpass instead of lowpass. By adjusting the bandwidth, the upper operating frequency and gain can be increased near the limits set by the $f_{max}$ & MAG (maximum achievable gain) of the FET.

As part of the networks providing the input and output coupling circuits, shunt capacitors and inductive stubs may be connected as shunt elements to a ground plane of the circuit. The precise locations and values of these elements and interconnecting transmission lines can be defined by a process of synthesis from the required passband characteristics.

The input and output coupling circuits may each comprise a inductive stub connected to the ground plane from a node in the vicinity of the amplifying device. Low balanced impedance levels may then be achieved at the amplifying device. These stubs may also serve to supply DC bias to the amplifying device, for example for the gate and drain of a FET device. Thus, the inductive stub may be connected to the ground plane via a DC-decoupling capacitor, and a DC supply terminal for the amplifying device may be connected to a node between the inductive stub and the DC decoupling capacitor.

Although the amplifying device could be connected at a capacitive node at or towards an end of the input coupling network, this arrangement may undesirably limit the maximum capacitance (and hence the size, power and gain) of the amplifying device which can be connected at this location. Therefore preferably, the amplifying device is connected at a capacitive node between a first network section from the input terminal and a second network section to the terminating resistor. In this case, a shunt capacitor may be connected to the ground plane from a node between the terminating resistor and the second section of the input coupling circuit.

Preferably, the impedance of the input coupling circuit reduces along the first network section to a minimum at the connection node of the amplifying device and then increases along the second network section to the terminating resistor. This permits the largest possible amplifying device (with the largest capacitance) to be connected. It can be achieved with an inductive stub connected to the ground plane from the capacitive node of the amplifying device.

A series capacitor may be present between the input and/or output terminal and its respective coupling circuit. Such a capacitor provides a DC break and can serve to raise or lower impedance levels when transformed through other circuit elements in the network.

The amplifying device may comprise a field-effect transistor having a gate electrode connected to the node between the first and second network sections of the input coupling circuit. Such a gate connection provides efficent capacitive coupling to the input circuit as required at the capacitive node. The field-effect transistor may be connected in a common source configuration between the input and output coupling circuits, the output coupling circuit providing a reactively matched network at the drain of the transistor. However other configurations of one or more FETs and/or other active elements may be used to form the amplifying device.

BRIEF DESCRIPTION OF THE DRAWING

These and other features in accordance with the present invention are illustrated specifically, by way of example in embodiments of the invention now to be described with reference to the accompanying drawings, in which.

Corresponding or similar circuit features in the different embodiments are generally given the same reference signs in all of the embodiments.

DESCRIPTION OF THE PREFERRED EMBODIMENTS

Figure 1:
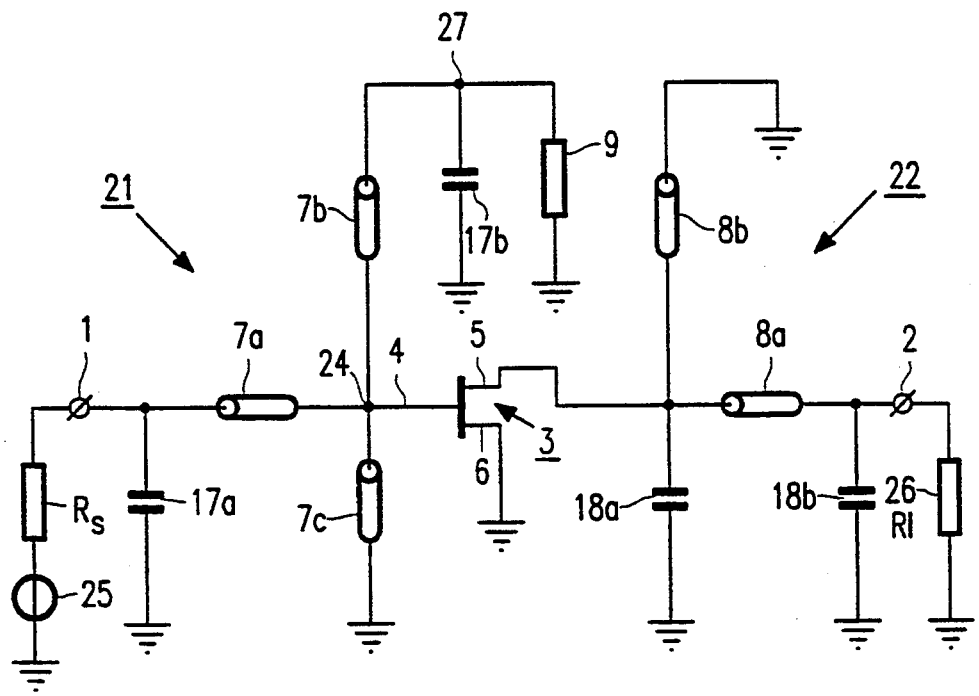
FIG. 1 is a circuit diagram of a cascable microwave amplifier stage in accordance with the invention.

The cascadable microwave circuit of FIG. 1 comprises a single amplifying device 3 which is connected to an input terminal 1 by an input coupling circuit 21 and to an output terminal 2 by an output coupling circuit 22. In the specific example illustrated in FIG. 1, the amplifying device 3 is a single FET connected in a common source configuration between the input and output coupling circuits 21 and 22. FIG. 1 illustrates a signal source 25 of impedance Rs at the input terminal 1 and an external load 26 of impedance R1 at the output terminal 2. Because the circuit of FIG. 1 is cascadable, the impedances of the source 25 and load 26 are substantially the same or at least similar. In a typical example, these impedances Rs and R1 may be 50 ohms.

In accordance with the present invention, the input coupling circuit 21 is a bandpass filter network of inductive transmission lines 7a, 7b, 7c and shunt capacitors 17a, 17b. This network supports a travelling wave within its passband and terminates at one end in a resistor 9 and at the other end in the resistance of the signal source 25 at the input terminal 1. The amplifying device 3 is connected at a capacitive node 24 between first and second successive sections 7a, 17a and 7b, 17b respectively of the bandpass filter network. The device 3 can be considered as replacing a shunt capacitor of the network 21. An input signal injected at the input terminal 1 from the source 25 is transmitted along the input coupling circuit 21 as a travelling wave which passes the capacitive node 24 (where an input to the amplifying device 3 is induced) and is dissipated in the terminating resistor 9. The resistor 9 acts as a matched load for the signal source 25.

Furthermore, in accordance with the present invention, the output coupling circuit 22 is designed as a reactively matched network of inductive transmission lines 8a, 8b and capacitors 18a, 18b having a bandpass characteristic. The amplifying device 3 and the output terminal 2 are at opposite ends of this network 22. Thus, the output coupling circuit 22 provides a reactively matched network at the drain 5 of the FET 3 of FIG. 1, so as to match its impedance at the terminal 2 to the impedance R1 of the external load 26.

The source 6 of the FET 3 is connected directly to a ground plane of the circuit. The FET 3 has its gate 4 connected to the node 24, and the voltage variations at this capacitive node 24 due to the travelling wave are transposed into an output current at the drain of the FET 3. The gain of this amplifier circuit is determined by the passband response of the filter network 21 and by the $f_t$ of the FET 3, where:

$$f_t = gm / (2\pi Cgs) \qquad (4)$$

Cgs being the input gate-source capacitance of the FET 3.

It can be of assistance in understanding this new amplifier circuit configuration in accordance with the present invention to view it (with hindsight of the invention) as a development from a known distributed amplifier circuit such as that of FIG. 1 of U.S. Pat. No. 4,853,649. As already described above, half the output current of the four FETs 3 of this distributed amplifier is wasted by travelling in the wrong direction on the drain line 8. This lost current is recovered in accordance with the present invention by removing the first three FETs and all the circuitry which is directly connected to these three FETs. The circuitry which remains after this removal is a single FET 3 in a common source configuration with its gate connected to the node between only two transmission line sections 7 which are terminated at one end by the internal load 9 and at the opposite end by the input terminal 1. As compared with the distributed amplifier with four FETs, the input matching characteristics should remain unchanged. The internal drain-line load 10 and all except one of the inductors 8 are removed from the output coupling circuit of FIG. 1 of U.S. Pat. No. 4,853,649. To recover a good output match, modest changes are required to the element values in what now becomes a reactive output matching network. The quality of the output match depends on the equivalent circuit of the FET. Some loss in bandwidth can be expected, but this is a worthwhile exchange for the recovery of the previously wasted output current from the FETs.

Such current recovery for all four FETs of the original circuit would have increased effective gm by a factor of 2 and therefore the gain (G) by a factor of 4. However, the increase for the cascadable gain stage is only a factor of 2 when the necessary changes in output impedances are taken into consideration. The elimination of all but one of the FETs reduces n by a factor of 4 and so reduces the gain G by a factor of 16 (see expression E(3) above). There is thus a net loss in gain G by a factor of 8. To bring the gain G back up to satisfactory (original) levels without using more FETs, it is necessary to increase the size of the single FET. An increase by a factor of approximately the square root of 8 is required to bring the gain back to its original level. Thus, the single FET 3 of FIG. 1 has almost three times the active area of one of the four FETs of an equivalent distributed amplifier.

A problem that arises from the bigger FET is that its gate capacitance is much bigger than that of the original FETs. If FET size is increased by a factor of 3, cut-off frequency $f_c$ decreases by the same factor for the same value of $Z_o$ (see expression E(2) above). Cut-off frequency $f_c$ could be increased again by a reduction in the impedance of the line, but this would decrease the gain G as indicated by expression E(3). Except at low microwave frequencies in the region of 2 GHz or below, the loss in gain would be unacceptable. The solution to the problem, which is one of the key attributes of the new circuit, is to make the gate filter network have a bandpass characteristic instead of a lowpass characteristic. For a given impedance level, a bandpass network allows a much greater gate capacitance to be accommodated which in turn allows the use of the larger FET 3. The actual size of the FET 3 depends on the frequency bandwidth required. The more narrow the bandwidth, the larger the FET 3 can be and the greater the gain G of the amplifier becomes.

Using a classical lumped-element lowpass-to-bandpass frequency transformation, it can be shown that the capacitance value of the total shunt capacitance of the bandpass network 21 of the FIG. 1 circuit in accordance with the present invention should be larger than that of a lowpass network by the following factor:

$$f_c/(f_2-f_1) \ldots E(5)$$

where $f_c$ is the cut-off frequency of the lowpass network;

$f_1$ is the lower band edge (cut-on) of the passband of the circuit network 21, and $f_2$ is the upper band edge (cut-off) of the passband of the circuit network 21.

With $f_c=f_2$, then the increased capacitance factor becomes:

$$f_2/(f_2-f_1) \ldots E(6)$$

Thus, the gate width of the FET 3 of the FIG. 1 circuit in accordance with the present invention can be increased by as much as this same factor E(6), giving an increase in gain G proportional to the square of the factor E(6). For a frequency bandwidth of an octave, this is a highly worthwhile factor of 4 (i.e. 6 dB).

In the input circuit network 21 of FIG. 1 the total shunt capacitance at the node 24 between sections 7a and 7b is provided by the gate-to-source capacitance of the FET 3, shunt capacitor 17a is connected to the ground plane from the input node 1 of the first section 7a of the circuit 21, and shunt capacitor 17b is connected from a node 27 between the terminating resistor 9 and the section 7b of the circuit 21.

This bandpass input network 21 comprises a shunt inductive stub 7c connected to the ground plane. Network synthesis techniques may be used to design the bandpass circuit 21 such that it requires only a single inductive stub 7c connected either at or at least near the capacitive connection node 24 of the FET 3. The precise position of the stub 7c can be adjusted to establish the required impedance matching level at the FET 3. In order to permit the FET 3 to have maximum size, it is desirable for the impedance of the input coupling circuit 21 to reduce along the first network section 7a to a minimum at the connection node 24 of the FET 3 and then to increase along the second network section 7b to the terminating resistor 9. In the particular example of FIG. 1 with symmetrical sections 7a and 7b, the first section 7a may transform the impedance down from 50 ohms at the signal source 25 to a few ohms (e.g. about 5 ohms) at node 24 and then the second section 7b may transform it up to about 50 ohms again at resistor 9.

The bandpass reactively-matched output network 22 of FIG. 1 also comprises shunt capacitors 18a and 18b and an inductive stub 8b which are connected as shunt elements to the ground plane of the circuit. As is the case for the travelling-wave input network 21, the reactively-matched output network 22 may be designed so that the inductive stub 8b is connected from a node in the vicinity of the FET 3. The provision of these stubs 7c and 8b at or near the amplifying device 3 facilitates access for gate and drain DC bias supplies to the FET 3. For this purpose, the stubs 7c and 8b need to be provided with DC supply terminals Vg and Vd and with DC decoupling capacitors to block the DC supply from the ground plane; these DC circuit elements are not shown in the RF circuit diagram of FIG. 1 for the sake of simplicity in the drawing. However, examples of such DC decoupling capacitors 17e and 18e and supply terminals Vg and Vd are included in FIGS. 2, 3 and 5.

Thus, the amplifier circuit of FIG. 1 in accordance with the present invention uses a travelling-wave matching technique for its input coupling circuit 21 and a reactive matching technique for its output coupling circuit 22. Computer simulations indicate that, using such input and output matching, gain levels of the order of 7 B can be achieved for a general purpose GaAs FET 3 operating over an octave bandwidth in the region of 10 GHz. This is only 1 dB below the kind of gain level that would be achieved with an equivalent totally reactively matched amplifier design. In marked contrast to the totally reactively matched design, the travelling-wave input and reactively matched output design of the present invention has input and output return losses that can be significantly better than 10 dB over the same octave bandwidth. Furthermore, the travelling wave input matching technique inherently compensates for the natural $-6$ dB/octave gain slope of the FET 3, giving the amplifier circuit a flat gain response.

Figure 2:
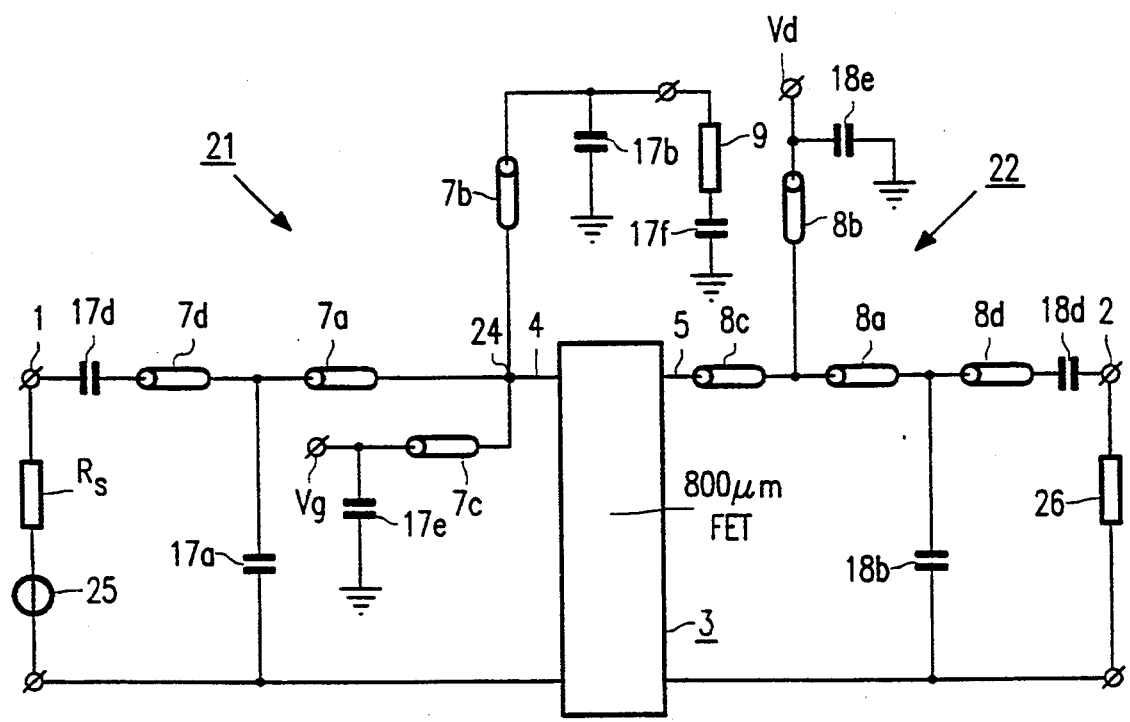
FIG. 2 is a circuit diagram of one example of a cascadable microwave amplifier stage designed in accordance with the invention for a particular FET amplifying device.
Figure 4:
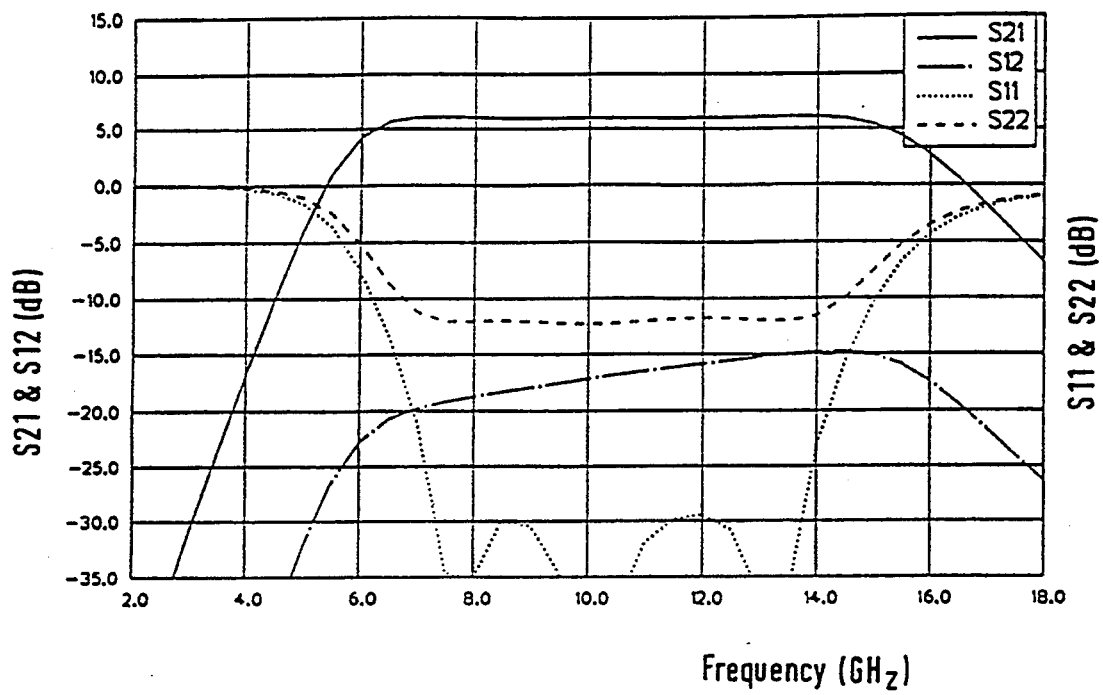
FIG. 4 is a plot of the simulated scattering parameters S11, S12, S21 and S22 with frequency in GHz for the circuit of FIG. 2.

FIG. 2 illustrates one specific example of a single-FET amplifier stage designed in this manner in accordance with the present invention, and its simulated frequency response is plotted in FIG. 4. The impedance of the signal source 25 and external load 26 are each 50 ohms. The amplifier stage is designed for the pass band ($f_1$ to $f_2$) of 7 GHz to 14 GHz using a GaAs MESFET 3 with a gate length of 0.7 $\mu$m and a gate width of 800 $\mu$m. The design is begun by analysing the equivalent circuit model of the MESFET in a common-source configuration, to determine the parasitic gate and drain capacitances that must be absorbed by the input and output matching networks 21 and 22. Then a bandpass input matching network is synthesised for an octave bandwidth, after verifying that the combination of bandwidth and FET size will give a useful level of gain. As illustrated in FIG. 2, the actual network 21 which is created by this synthesis has extra elements 7d and 17d at the input, as compared with the basic network 21 of FIG. 1. These two extra elements are a series capacitor 17d and a transforming inductive transmission line 7d, and they serve to lower further the impedance level at the gate 4 of the FET 3 to assist with the absorption of the rather large gate capacitance of this FET 3. Furthermore the series capacitor 17d between the input terminal 1 and the input network 21 acts as a DC break, isolating the DC bias on the gate of FET 3 from the RF input from source 25.

By then re-analysing the FET model with the input network 21 connected, it is possible to derive new values of equivalent shunt capacitance and resistance looking back into the drain 5 of the FET 3. Using these values, the output matching network 22 is then synthesised with the appropriate bandwidth to absorb the shunt capacitance and to transform the resistance value to the value of the output load R1. A series capacitor 18d and inductive transmission line 8d are added at the output, similar to the additions at the input. The capacitor 18d provides a second DC break. The inductive stub 8b has been moved slightly away from the FET 3 to maintain the desired impedance level at the drain 5.

With the two networks 21 and 22 in place on the two sides of the FET 3, an analysis of the whole circuit is then performed to optimise the values of the individual elements. The resultant circuit element values are given in the following table:

TABLE

FIG. 1

| Input Network 21 | | Output Network 22 | |
|---|---|---|---|
| Component: | Value: | Component: | Value: |
| Rs | 50Ω | R1 (26) | 50Ω |
| 9 | 19.1Ω | 18b | 0.52pF |
| 17a | 0.69pF | 18d | 0.48pF |
| 17b | 0.57pF | 18e | 5pF |
| 17d | 0.39pF | 8a | 90/0.458 |
| 17e | 5pF | 8b | 90/1.163 |
| 17f | 5pF | 8c | 90/1.363 |
| 7a | 90/0.885 | 8d | 90/2.10 |
| 7b | 90/0.889 | | |
| 7c | 90/0.647 | | |
| 7d | 90/2.480 | | |

The resistance value of the internal load 9 of the input coupling circuit 21 is 19.1 ohms. The capacitance values of the individual capacitors are shown in picoFarads. In this example DC decoupling capacitors 17e, 17f and 18e which provide an RF connection of the respective elements 7c, 9 and 8b to the ground plane are also shown in FIG. 2. The transmission line elements 7a to 7d and 8a to 8d all have the same characteristic impedance Zo of 90 ohms, but their lengths are all different. These different length values in mm are given by the second number for that element in the Table, e.g. 90/2.480 for line 7d indicates Zo of 90 ohms and a length of 2.480 mm. The differences in length were adopted to simplify the physical realisation of the circuit in MMIC technology and were derived by trading line impedance against length. Since the individual lines are much shorter than a quarter of a wavelength in the region of the passband, these lines are always inductive; thus, their effective inductance can be preserved after an adjustment of length, so long as the product of length and impedance remains approximately the same.

Figure 3:
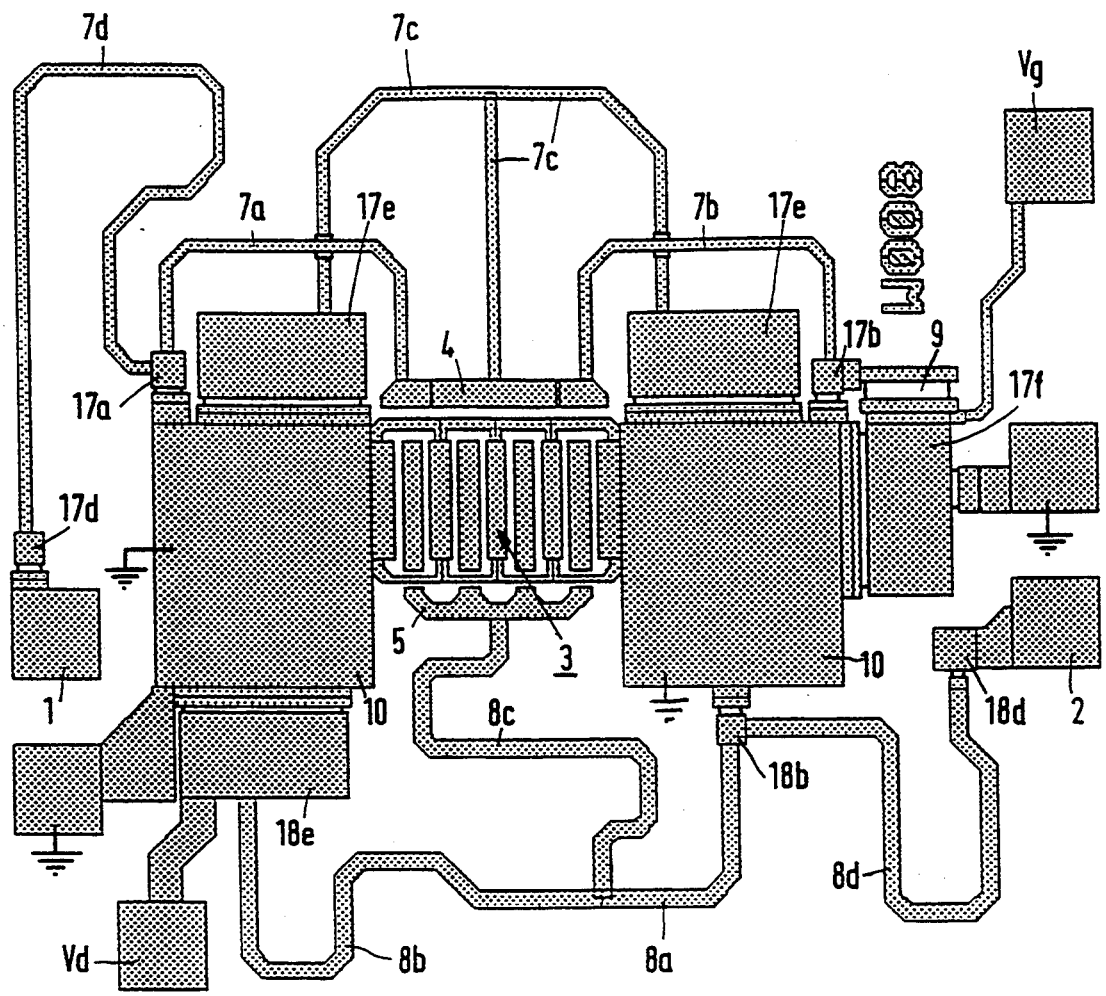
FIG. 3 is a MMIC layout plan showing the main level metallization pattern of one example of an MMIC embodiment of the circuit of FIG. 2.

FIG. 3 shows one example of an MMIC layout of the circuit of FIG. 2 and illustrates the compactness of the circuit. For clarity in the drawing FIG. 3 is based on only the pattern of the main metallization level at the upper surface of the GaAs circuit substrate. This pattern is shown hatched in FIG. 3 with a dotted in-fill, again for clarity in the drawing. The various parts of this pattern which form or belong to the various circuit elements are designated by the reference signs of these circuit elements. There is a ground plane metallization (not shown) on the bottom surface of the substrate (also not shown); and there are, for example, via-hole connections through the thickness of the substrate between the bottom ground plane and ground metallization areas 10 of the pattern shown in FIG. 3. The inductive transmission lines 7a, 7b, 8a, etc., are designed in known manner as microstrip lines. Because FIG. 3 is based on only one level in the layout, it does not show all the regions and complete connections of the circuit elements which employ other layout levels. Thus, for example, there are unhatched gaps in FIG. 3 where the resistor region 9 is provided and where bridging connections are provided between parts of the lines 7c which cross the lines 7a and 7b, and there are unhatched gaps between capacitors (e.g. 17d) and lines (e.g. 7d) where the line is connected to the other plate (not shown) of the capacitor. FIG. 4 is a plot of the resultant frequency responses of the FIG. 2 circuit, in terms of the scattering parameters S11, S12, S21 and S22. The forward transmission coefficient S21 is a measure of the gain G which FIG. 4 shows to be 6.05±0.05 dB. The input match (as measured by the input reflection coefficient S11 is better than −20 dB over the whole of the 7 to 14 GHz band. The output match (as measured by the output reflection coefficient S22) is flat and better than −12 dB over the 7 to 14 GHz band.

The amplifier circuits of FIGS. 1 and 2 have a sufficiently good match at both input and output terminals 1 and 2 for bandwidths in excess of an octave that several such circuits can be cascaded without undesirable interactions. With each amplifier stage producing between 5 and 10 dB gain depending on the frequency bandwidth, the present invention renders it possible to produce compact multi-stage amplifiers with, for example, 40 dB gain on a single MMIC substrate. The circuits forming the individual cascaded stages of the amplifier may be duplicates of one another or modified versions of one or more basic circuits having a circuit configuration in accordance with the present invention. The travelling-wave input matching technique can also be used to considerable effect in interstage networks of multi-stage amplifiers; the increased tolerance obtained by matching in this manner allows single unbalanced FET stages to be cascaded without needing directional couplers to avoid strong interactions between the stages. The controlled losses introduced by travelling-wave matching networks constructed in accordance with the present invention can in this situation overcome stability problems, increase the bandwidth and correct the gain slope.

Figure 5:
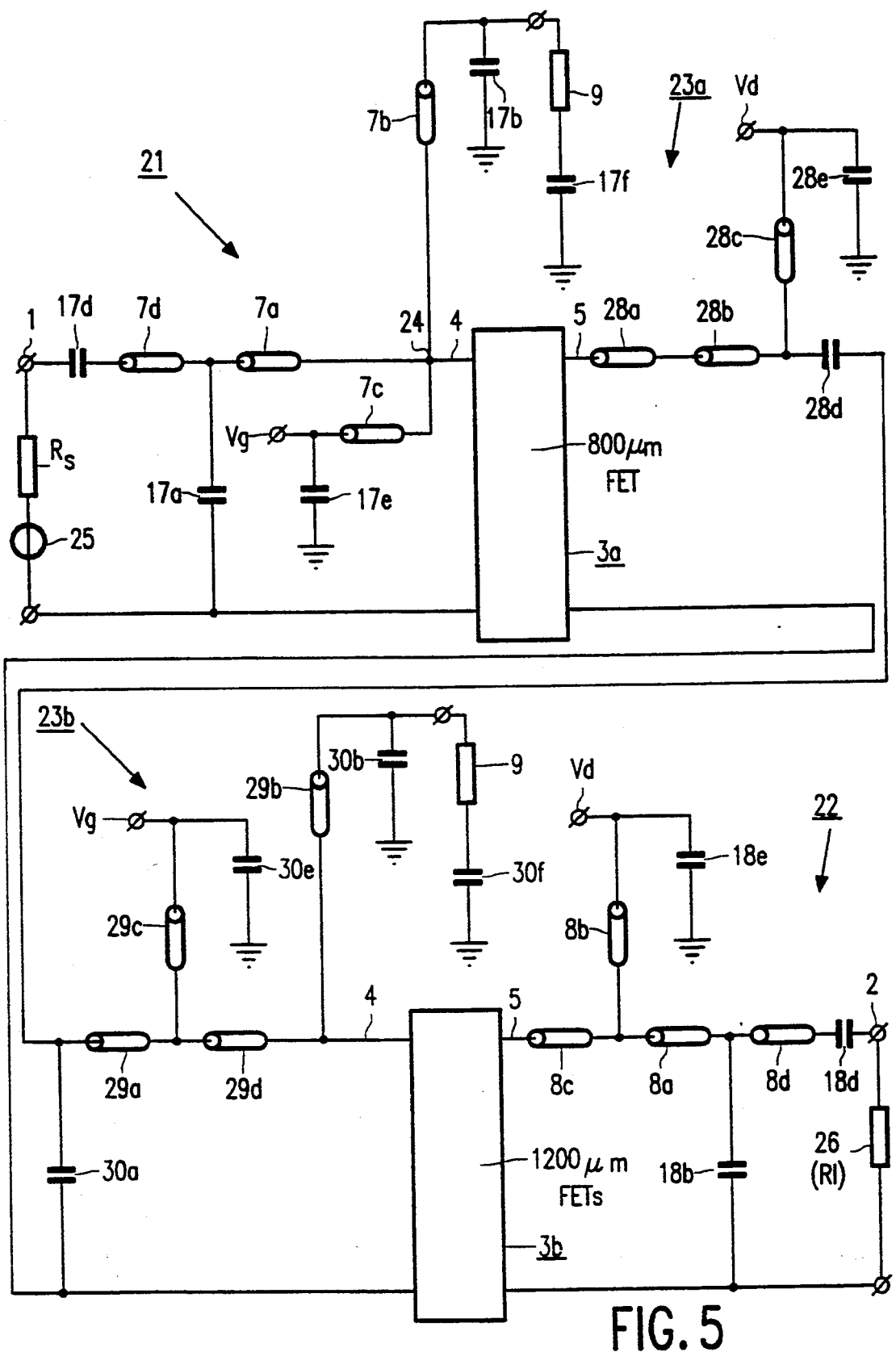
FIG. 5 is a circuit diagram of one example of a 2-stage amplifier having two cascaded amplifier circuits in accordance with the present invention.

By way of example, FIG. 5 illustrates an equivalent circuit of a 2-stage amplifier in accordance with the present invention. The two stage amplifier is designed to give an overall gain of 12 dB from 7 GHz to 14 GHz. The first stage is similar to FIG. 2 and based on a single FET 3a of 800 μm gate width. This first stage drives a second stage comprising a pair of parallel FETs 3b each of 1200 μm gate width. For convenience in the drawing, the circuit of FIG. 5 is shown in two separate sections which are cascaded at the nodes A-B.

The input coupling circuit 21 of the first stage is almost identical to that of FIG. 2, but with slightly different values for the individual circuit elements. This input circuit 21 and the 800 μm gate FET 3a are followed by an interstage network 23, followed by the pair of 1200 μm gate FETs 3b connected in parallel, and then a reactive output matching network 22. The FIG. 5 circuit is designed in a systematic manner using network synthesis, and the resultant circuit element values are given in the following table:

TABLE

FIG. 5

| Component: | Value: | Component: | Value: |
|---|---|---|---|
| Input Network 21 | | Interstage Network 23 | |
| Rs | 50Ω | 9 | 8.65Ω |
| 9 | 19.8Ω | 28a | 90/0826 |
| 17a | 0.60pF | 28b | 45/1.593 |
| 17b | 0.54pF | 28c | 45/1.265 |

TABLE-continued

FIG. 5

| Component: | Value: | Component: | Value: |
|---|---|---|---|
| 17d | 0.39pF | 28d | 1.88pF |
| 17e | 5pF | 28e | 5pF |
| 17f | 5pF | 29a | 22.5/0.205 |
| 7a | 90/0.905 | 29b | 22.5/1.416 |
| 7b | 90/0.816 | 29c | 22.5/0.340 |
| 7c | 90/0.658 | 29d | 22.5/0.347 |
| 7d | 90/2.473 | 30a | 6.86pF |
| | | 30b | 1.60pF |
| | | 30e | 5pF |
| | | 30f | 5pF |
| Output Network 22 | | | |
| R1 (26) | 50Ω | 8a | 35/2.711 |
| 18b | 0.42pF | 8b | 22.5/2.413 |
| 18d | 0.57pF | 8c | 17.5/0.720 |
| 18e | 5pF | 8d | 70/2.427 |

For convenience in the drawings the interstage matching network 23 is shown split into two separate sections 23a and 23b which are cascaded at the nodes A–B. The interstage matching network 23 is synthesised as one complete network; it is reactively matched to the first amplifying device 3a and has travelling-wave matching characteristics to the second amplifying device 3b. At its left end nearest the 800 μm FET 3a, the interstage network 23 is designed to absorb the shunt drain capacitance of the FET 3a, and there is no separate shunt capacitor 18a as is included in the output network 22 of FIG. 1. Moving along the network 23 to the right, the two lines 28a and 28b in cascade behave essentially like a single line, although it can be convenient for the layout of the circuit in an MMIC to form them as two distinct lines 28a and 28b. The following shunt stub 28c provides a point of access for DC drain supply Vd to the 800 μm FET 3a. The series capacitor 28d provides a necessary DC break between the 800 μm FET 3a and the 1200 μm FETs 3b. Both the stub 28c and capacitor 28d are also important for establishing the desired impedance levels along the network 23. The rest of the network 23 leading to the 1200 μm FETs 3b is the same as the input network 21 of FIG. 2, but with different element values and with the shunt stub 29c shifted slightly away from the FETs 3b. Shunt capacitor 30a in this network 23 is of large value, i.e. an order of magnitude larger than 17a and 18b. The locational shift in stub 29c splits the first transmission line section into two lengths 29a and 29d so as to make another adjustment in impedance levels.

The output matching network 22 is reactive like that of FIG. 2, except that in this power amplifier it is synthesised as a singly-terminated network. The singly-terminated network helps in extracting maximum power from the two output FETs 36, and this is more important than achieving a good output reflection coefficient.

Figure 6:
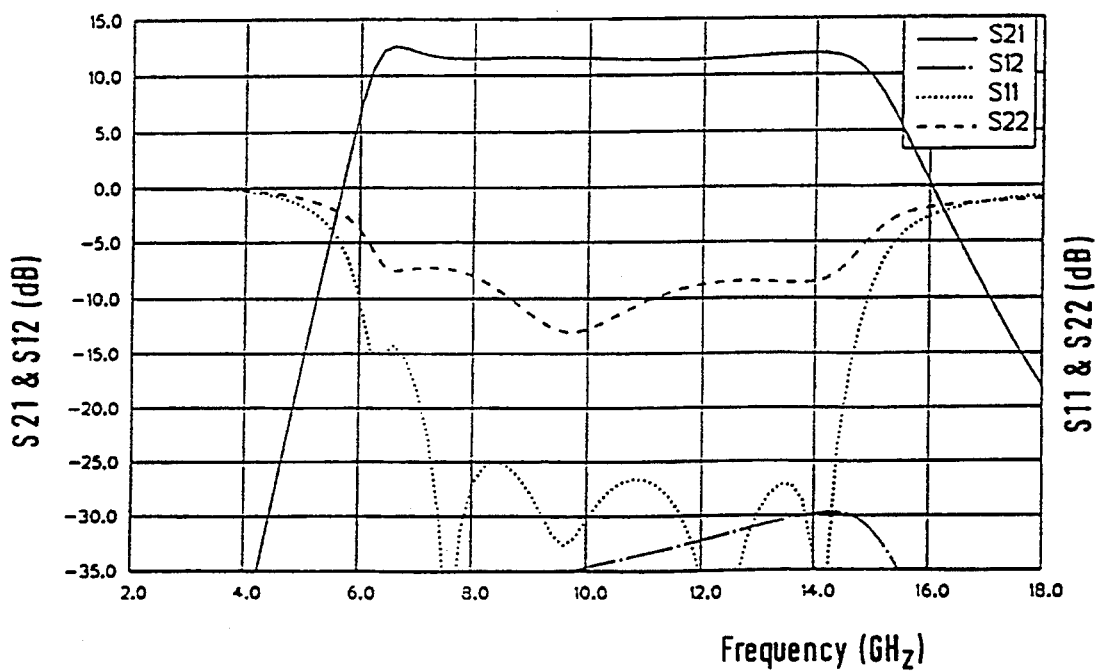
FIG. 6 is a plot of simulated scattering parameters S11, S12, S21 and S22 with frequency f in GHz for the circuit of FIG. 5.

As can be seen from FIG. 6, the resulting gain (S21) is 12 dB and flat over the 7 GHz to 14 GHz frequency range, and the input match (S11) is better than −25 dB. Output match (S22) is generally less than −10 dB, but such an outcome is the expected result of designing for maximum output power.

Many other variations and modifications are possible in different embodiments of the present invention. In the embodiments so far described, the amplifying device 3 is a single FET 3 or a pair of parallel FETs 3b. The FET is in a common source configuration and has a single gate terminal 4. Such a FET device provides a most compact arrangement. However, other and more complex amplifying devices 3 may be used in circuits in accordance with the present invention. Thus, for example, a dual-gate FET may be used as the amplifying device 3 with a gain control input at its second gate, as described in U.S. Pat. No. 4,595,881. In another form, the amplifying device 3 may comprise a darlington amplifier of two FETs which may be connected in cascade with a further FET, as described in U.S. Pat. No. 4,876 516.

FIGS. 1, 2, 3 and 5 show the FETs 3 at optimum locations in the network 21, for optimising gain and bandwidth. However, in a circuit in accordance with the invention, the amplifying device 3 (and associated shunt inductor 7c) may be capacitively connected at any location along the travelling-wave network 21 where a shunt capacitor is required. In an extreme case, the amplifying device 3 may even be connected at the capacitive node 27 (to replace the capacitor 17b) at the end of the network 21 before the terminating load resistor 9. However, such an extreme location will significantly reduce the gain, because the shunt capacitor values at the end of the network tend to be smaller; furthermore, the resistor 9 will be strongly coupled to the amplifying device 3 which is generally less desirable.

In summary, the new amplifier circuits described with reference to the accompanying drawings can be thought of as a development from the distributed amplifier concept, offering many of the same desirable characteristics. Like distributed amplifiers, the new circuits are wideband, provide flat gain, have excellent input and output reflection coefficients (S11 & S22) and have high tolerance to inaccuracies in circuit modelling or variations in the fabrication process. As well as having these characteristics, the new circuits also occupy very much less space than distributed amplifiers, have a much high gain/unit area, and have twice the power output per unit gate width, twice the efficiency and half the power consumption. Furthermore, unlike the distributed amplifier, they require only a single amplifying device 3.

In terms of size, the new circuits compare more closely with a reactively matched amplifier gain stage. The output matching network 22 is similar to that of a conventional reactively matched stage but is bandpass. The input matching network 21 is quite different. In a reactively matched amplifier, the input network must reflect energy at low signal frequencies to correct for the natural −6 dB/octave gain slope of a FET amplifying device. Such action necessarily degrades input match. However, in the new circuits, this surplus energy is absorbed in the network 21, rather than reflected, and thereby preserves an excellent input match.

It will be evident that the same design principles in accordance with the invention may be applied to other microwave circuits which may be variations of the microwave amplifier circuits described above or which may be completely different. Thus from reading the present disclosure, other variations and modifications will be apparent to persons skilled in the art. Such variations and modifications may involve equivalents and other features which are already known in the design, manufacture and use of microwave amplifier circuits and other circuits and component parts thereof, and which may be used instead of or in addition to features already described herein. Although claims have been formulated in this application to particular combinations of features, it should be understood that the scope of the disclosure of the present application also includes any novel feature or any novel combination of features disclosed hereineither explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A microwave circuit comprising an amplifying device which is connected to an input terminal by an input coupling circuit and to an output terminal by an output coupling circuit, wherein the input coupling circuit comprises a bandpass filter network for travelling-wave transmission within its passband and terminates in the input terminal at one end and a terminating resistor at an opposite end, and the amplifying device is connected at a capacitive node of the network for receiving an input signal from a travelling wave which is transmitted from the input terminal, and which passes the capacitive node to be dissipated in the terminating resistor, and the output coupling circuit is a bandpass reactively-matched network having the amplifying device and the output terminal at opposite ends of the network.

2. A microwave circuit as claimed in claim 1, wherein the input and output coupling circuits each include a capacitor and an inductive stub which is connected as a respective shunt element to a ground plane of the circuit.

3. A microwave circuit as claimed in claim 2, wherein the input and output coupling circuits each comprise an inductive stub connected to the ground plane from a node in the vicinity of the amplifying device.

4. A microwave circuit as claimed in claim 3, wherein the inductive stub is connected to the ground plane via a DC decoupling capacitor, and a DC supply terminal for the amplifying device is connected to a node between the inductive stub and the DC decoupling capacitor.

5. A microwave circuit as claimed in any one of claims 2, 3 or 4, wherein the input coupling circuit comprises an inductive stub connected to the ground plane from the capacitive node at which the amplifying device is connected.

6. A microwave circuit as claimed in any one of claims 1, 2, 3 or 4, wherein the capacitive node at which the amplifying device is connected is present between a first network section from the input terminal and a second network section to the terminating resistor, and a shunt capacitor is connected to the ground plane from a node between the terminating resistor and the second network section.

7. A microwave circuit as claimed in any one of claims 1, 2, 3 or 4, wherein the impedance of the input coupling circuit reduces along a first network section to a minimum at the capacitive node of the amplifying device and then increases along a second network section to the terminating resistor.

8. A microwave circuit as claimed in any one of claims 1, 2, 3 or 4, wherein the the input coupling circuit comprises a series capacitor in the vicinity of the input terminal.

9. A microwave circuit as claimed in any one of claims 1, 2, 3 or 4, wherein the output coupling circuit comprises a series capacitor in the vicinity of the output terminal.

10. A microwave circuit as claimed in any one of claims 1, 2, 3 or 4, wherein the amplifying device comprises a field-effect transistor having a gate electrode connected at the capacitance node of the input coupling circuit.

11. A microwave circuit as claimed in claim 10, wherein the field-effect transistor is connected in a common source configuration between the input and output coupling circuits, the output coupling circuit providing a reactively matched network at the drain of the transistor.

12. A microwave circuit as claimed in any one of claims 1, 2, 3 or 4 and comprising first and second amplifier stages connected in cascade, each amplifier stage comprising a said amplifying device between said input and output coupling circuits, the output coupling circuit of the first amplifier stage being cascaded into the input coupling circuit of the second amplifier stage to form a single inter-stage network which is reactively matched to the first amplifier device and which has travelling-wave matching characteristics to the second amplifier device.

* * * * *